United States Patent
Parris et al.

(10) Patent No.: US 9,780,558 B2
(45) Date of Patent: Oct. 3, 2017

(54) SEMICONDUCTOR DEVICE AND RELATED PROTECTION METHODS

(71) Applicants: Patrice M. Parris, Phoenix, AZ (US); Weize Chen, Phoenix, AZ (US); Richard J. De Souza, Chandler, AZ (US); Mazhar Ul Hoque, Gilbert, AZ (US)

(72) Inventors: Patrice M. Parris, Phoenix, AZ (US); Weize Chen, Phoenix, AZ (US); Richard J. De Souza, Chandler, AZ (US); Mazhar Ul Hoque, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 447 days.

(21) Appl. No.: 14/567,291

(22) Filed: Dec. 11, 2014

(65) Prior Publication Data

US 2016/0172845 A1 Jun. 16, 2016

(51) Int. Cl.
*H02H 9/00* (2006.01)
*H02H 9/04* (2006.01)
*H01L 27/02* (2006.01)

(52) U.S. Cl.
CPC .......... *H02H 9/04* (2013.01); *H01L 27/0251* (2013.01); *H02H 9/046* (2013.01)

(58) Field of Classification Search
CPC ....................................................... H02H 9/04
USPC ........................................................ 361/56
See application file for complete search history.

(56) References Cited

U.S. PATENT DOCUMENTS

| | | | |
|---|---|---|---|
| 4,268,846 A | 5/1981 | Spellman et al. | |
| 5,212,618 A | 5/1993 | O'Neill et al. | |
| 5,825,600 A | 10/1998 | Watt | |
| 5,856,904 A * | 1/1999 | Pelly | H02H 3/50 361/111 |
| 6,157,530 A | 12/2000 | Pequignot et al. | |
| 6,600,356 B1 | 7/2003 | Weiss | |
| 7,911,750 B2 | 3/2011 | Zhan et al. | |
| 8,242,566 B2 | 8/2012 | Zhan et al. | |
| 8,279,566 B2 | 10/2012 | Whitfield et al. | |
| 8,432,654 B2 | 4/2013 | Whitfield et al. | |
| 8,861,158 B2 * | 10/2014 | Zupcau | H01L 27/0285 361/56 |
| 2013/0075854 A1 | 3/2013 | Chang et al. | |

OTHER PUBLICATIONS

Sarbishaei, H. et al., "A New Flip-Flop-Based Transient Power Supply Clamp for ESD Protection," IEEE Transactions on Device and Materials Reliability, vol. 8, No. 2, Jun. 2008.

(Continued)

*Primary Examiner* — Stephen W Jackson (57) ABSTRACT

Semiconductor devices and related electrostatic discharge (ESD) protection methods are provided. An exemplary semiconductor device includes an interface for a signal and a multi-triggered protection arrangement coupled between the interface and a reference node to initiate discharge of the signal between the interface and the reference node based on any one of a plurality of different characteristics of the signal. Discharge of the signal at the interface is initiated based on a first characteristic of the signal, and thereafter, the discharge of the signal at the interface is maintained based on another characteristic of the signal.

20 Claims, 3 Drawing Sheets

(56) References Cited

OTHER PUBLICATIONS

Chen, W., U.S. Appl. No. 14/644,041 entitled "Stacked Protection Devices With Overshoot Protection and Related Fabrication Methods," filed Mar. 10, 2015.
Chen, W., U.S. Appl. No. 14/034,213 entitled "Stacked Protection Devices and Related Fabrication Methods," filed Sep. 23, 2013.
USPTO, Office Action in U.S. Appl. No. 14/034,213, dated May 14, 2015.
USPTO, Final Office Action in U.S. Appl. No. 14/034,213, dated Nov. 17, 2015.

* cited by examiner

SEMICONDUCTOR DEVICE AND RELATED PROTECTION METHODS

TECHNICAL FIELD

Embodiments of the subject matter described herein relate generally to semiconductor devices, and more particularly, embodiments of the subject matter relate to providing enhanced electrostatic discharge protection.

BACKGROUND

Modern electronic devices, and particularly, integrated circuits, are at risk of damage due to electrostatic discharge (ESD) events. During an ESD event, a voltage (or current) may be provided to one or more terminals of an electronic device that causes the voltage between those terminals (or other terminals of the electronic device) to exceed the designed maximum voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages and/or currents across electrical components during ESD events.

To avoid interfering with normal operation of the device being protected, the discharge protection circuitry is typically designed to turn on and conduct current when the applied voltage exceeds the operating voltage of the device but before the applied voltage exceeds the breakdown voltage of the device. However, there is often a period of time between when the applied voltage exceeds the operating voltage of the device and when the applied voltage reaches the transient triggering voltage that fully turns on the discharge protection circuitry. During this time, the components of the device may be exposed to a portion of the discharge current, which, in turn, could undesirably impact the functionality of the components in the future. Existing approaches often involve tuning the breakdown voltages of the discharge protection circuitry to achieve the desired ESD performance; however, this often incurs area penalties or otherwise increases costs associated with the discharge protection circuitry.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

In practice, it is desirable to minimize the exposure of device components to electrostatic discharge (ESD) current once the ESD voltage exceeds the design voltage of the device. Accordingly, embodiments of the present invention utilize multiple ESD triggering arrangements to reduce device components' exposure to the ESD current. In this regard, a multi-triggered protection arrangement initiates discharge of a signal at an input/output (I/O) interface by providing a conductive path for dissipating current electrically parallel to the functional device components based on a first characteristic of the signal, such as, for example, a frequency or a rise time of the signal. Thereafter, the multi-triggered protection arrangement maintains discharge of the signal based on one or more other characteristics of the signal until detecting that the ESD event has been effectively dissipated or otherwise ceases. For example, the discharge may be maintained until the voltage of the signal falls below the maximum safe operating voltage of the device components or otherwise falls below a holding voltage of the discharge circuitry. The ESD protection triggers may be configured to trigger discharging in a manner that overlaps in time, such that they reduce the exposure of device components to the ESD event for the entire duration from the initial triggering until the ESD event has effectively ceased.

Figure 1:
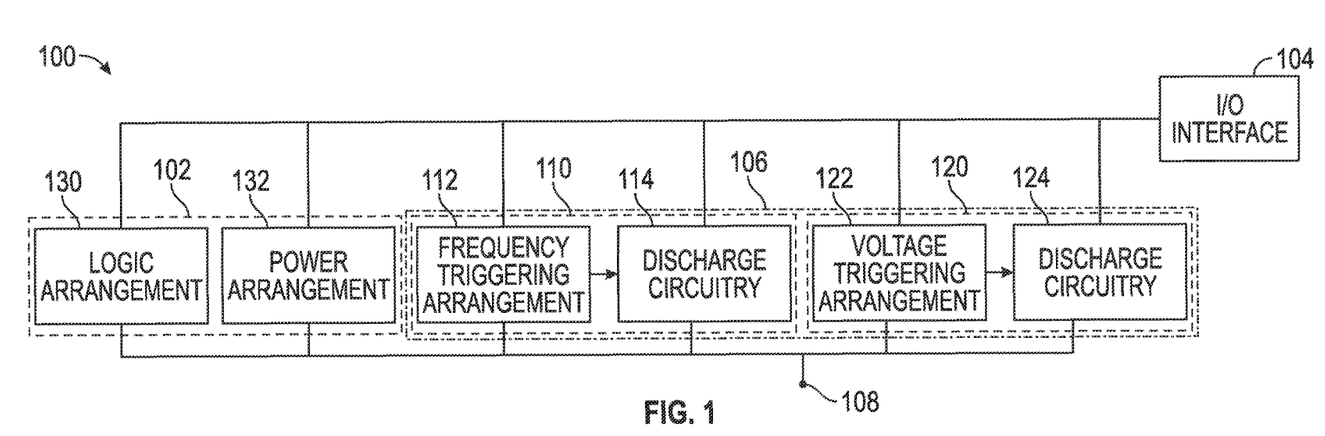
FIG. 1 depicts a block diagram of a semiconductor device including a multi-triggered electrostatic discharge protection arrangement in accordance with one or more embodiments of the invention.

FIG. 1 depicts a block diagram of an exemplary semiconductor device 100 in accordance with one or more exemplary embodiments of the present invention. The semiconductor device 100 includes, without limitation, functional circuitry 102 coupled to an input/output (I/O) interface 104 and multi-triggered discharge protection arrangement 106 coupled to the I/O interface 104. The multi-triggered discharge protection arrangement 106 is configured electrically parallel to the functional circuitry 102 between the I/O interface 104 and a reference node 108. Depending on the embodiment, the reference node 108 may be a ground reference voltage node for the semiconductor device 100 or another reference voltage node for the functional circuitry 102.

In exemplary embodiments, the functional circuitry 102 and the protection arrangement 106 are formed, fabricated, mounted, or otherwise provided on one or more substrates or dies and encapsulated in a common device package to obtain the semiconductor device 100. In this regard, the I/O interface 104 generally represents the physical interface for providing electrical signals to or receiving electrical signals from the functional circuitry 102 encapsulated in the semiconductor device 100. Depending on the embodiment, the package interface 104 may be realized as one or more individual pins, pads, leads, terminals, solder balls, or another suitable physical interface to the semiconductor device 100. In some embodiments, the reference node 108 may be connected to another package interface of the semiconductor device 100 for receiving the ground reference voltage for the semiconductor device 100.

It should be understood that FIG. 1 is a simplified representation of the semiconductor device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner. Additionally, while in some embodiments, the functional circuitry 102 and the protection arrangement 106 are fabricated on a common semiconductor substrate, in other embodiments, the functional circuitry 102 and the protection arrangement 106 may be fabricated on separate dies that are soldered, affixed, or otherwise mounted to a package substrate (e.g., a lead frame, circuit board, or the like) before encapsulation.

The functional circuitry 102 generally represents the components of the semiconductor device 100 configured to provide a desired functionality for the semiconductor device 100. In this regard, depending on the embodiment, the functional circuitry 102 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide a desired functionality for the semiconductor device 100.

In the illustrated embodiment, the semiconductor device 100 is a smart power device, where the functional circuitry 102 includes a power arrangement 132 configured to desired power handling capability for the semiconductor device 100 coupled to a logic arrangement 130 configured to intelligently control, manage, or otherwise operate the power arrangement 132. For example, the power arrangement 132 may include one or more power transistors, amplifiers and/or other discrete components configured to drive a motor or communicate with other components of a larger electrical system that includes the semiconductor device 100, while the logic arrangement 130 includes the logic circuitry configured to implement a motor drive algorithm or communications protocol. In accordance with one or more embodiments, the I/O interface 104 receives a positive (relative to the ground reference node 108) direct current (DC) supply reference voltage for the power arrangement 132 of the semiconductor device 100.

The multi-triggered protection arrangement 106 is connected between the I/O interface 104 and the reference node 108 and configured electrically parallel to the functional circuitry 102 to protect the functional circuitry 102 from a transient voltage at the I/O interface 104 that exceeds a breakdown voltage or other design (or operating) voltage of the functional circuitry 102. The illustrated protection arrangement 106 includes, without limitation, a first discharge arrangement 110 coupled electrically parallel to the functional circuitry 102 to initiate discharge of the electrical signal at the interface 104 based on a first discharge triggering criterion and a second discharge arrangement 120 coupled electrically parallel to the functional circuitry 102 to initiate discharge of the electrical signal at the interface 104 based on a second discharge triggering criterion that is different from the first discharge triggering criterion. In this regard, the discharge triggering criteria may be chosen such that the discharge arrangements 110, 120 respectively begin clamping a voltage difference between the I/O interface 104 and the reference node 108 and discharging current at the I/O interface 104 at different times to reduce the exposure of the functional circuitry 102 to an ESD signal at the I/O interface 104. For example, the first discharge arrangement 110 may be configured to identify or otherwise detect an ESD event before the second discharge arrangement 120, such that the first discharge arrangement 110 functions as an ESD buffer before the second discharge arrangement 120 begins discharging.

In exemplary embodiments, the discharge triggering criteria are chosen such that the respective durations of time during which the respective discharge arrangements 110, 120 are discharging the current or voltage at the I/O interface 104 overlap at least in part. Thus, in such embodiments, the discharge arrangements 110, 120 concurrently discharge the current or voltage at the I/O interface 104 for that overlapping duration. Additionally, in exemplary embodiments, the discharge arrangements 110, 120 are configured to provide different power handling capabilities for discharging the I/O interface 104. For example, the second discharge arrangement 120 may begin discharging the I/O interface 104 after the first discharge arrangement 110 but provide a higher power handling capability than the first discharge arrangement 110. Accordingly, the area of the discharge circuitry 114 of the first discharge arrangement 110 may be smaller than the area of the discharge circuitry 124 of the second discharge arrangement 120. For example, the area of the discharge circuitry 114 may be reduced to the minimum area required to buffer the ESD event from the time the voltage at the I/O interface 104 exceeds the design voltage of the functional circuitry 102 until the time the discharge circuitry 124 of the second discharge arrangement 120 is fully turned on to minimize the incremental cost of the improved level of ESD protection.

Still referring to FIG. 1, in exemplary embodiments, the first discharge arrangement 110 initiates discharge based on a characteristic of the signal at the interface 104 that is different from the signal characteristic utilized by the second discharge arrangement 120 to initiate discharging. In this regard, the first discharge arrangement 110 includes a triggering arrangement 112 that monitors a signal characteristic at the interface 104 that is different than the signal characteristic at the interface 104 that is monitored by the triggering arrangement 122 of the second discharge arrangement 120. For example, the first triggering arrangement 112 may monitor a rise time or frequency of the voltage at the interface 104 while the second triggering arrangement 122 monitors the magnitude of the voltage at the interface 104. Accordingly, for purposes of explanation, but without limitation, the first triggering arrangement 112 may alternatively be referred to herein as the frequency triggering arrangement 112 and the second triggering arrangement 122 may alternatively be referred to herein as the voltage triggering arrangement 122.

In exemplary embodiments, when the frequency of the voltage at the interface 104 is greater than a threshold frequency (or alternatively, the rise time of the voltage at the interface 104 is less than a threshold amount), the frequency triggering arrangement 112 activates or otherwise initiates operation of discharge circuitry 114 connected between the I/O interface 104 and the reference node 108 to begin discharging the current from/to the I/O interface 104 to/from the reference node 108. The threshold frequency is chosen to be greater than a maximum operating frequency associated with the I/O interface 104 during normal operation of the semiconductor device 100 to avoid interfering with operation of the functional circuitry 102. For example, if the frequency of the voltage at the I/O interface 104 is about 100 kilohertz (kHz) or less during normal operation, the threshold frequency may be chosen to be 200 kHz such that the frequency triggering arrangement 112 does not activate the discharge circuitry 114 until identifying an electrical signal at the I/O interface 104 with a frequency (or rise time) that is at least twice as fast (or half as long) as the fastest expected electrical signals. It will be appreciated that when the frequency-triggered discharge circuitry 114 is activated, ESD current that could otherwise be dissipated by the functional circuitry 102 will be dissipated, at least in part, by the discharge circuitry 114, thereby reducing the exposure of the functional circuitry 102 to the ESD current. In exemplary embodiments, the discharge circuitry 114 is realized as one or more transistors, diodes, resistors, and/or other discrete components configured to clamp the voltage difference between the reference node 108 and the I/O interface 104 (e.g., to the holding voltage for the discharge circuitry 114) and slow the increase of the voltage difference between the reference node 108 and the I/O interface 104 while discharge circuitry 124 is activated.

In exemplary embodiments, when the magnitude of the voltage at the interface 104 is greater than a triggering voltage, the voltage triggering arrangement 122 activates or otherwise initiates operation of discharge circuitry 124 connected between the I/O interface 104 and the reference node 108 to discharge the current from/to the I/O interface 104 to/from the reference node 108. The triggering voltage of the voltage triggering arrangement 122 is greater than the operating voltage of the functional circuitry 102 to avoid interfering with normal operation of the functional circuitry 102 but less than the breakdown voltage of the functional circuitry 102 to protect the functional circuitry 102 from ESD events. When activated, the discharge circuitry 124 further dissipates the ESD current to further reduce the exposure of the functional circuitry 102 to the ESD current. In exemplary embodiments, the discharge circuitry 124 is realized as one or more transistors, diodes, resistors, and/or other discrete components configured to clamp the voltage difference between the reference node 108 and the I/O interface 104 to a holding voltage that is less than the breakdown voltage of the functional circuitry 102 but greater than the normal operating voltage range of the functional circuitry 102.

As described in greater detail below in the context of FIG. 4, the frequency triggering arrangement 112 activates the first discharge circuitry 114 to conduct current and initiate the discharge between the interface 104 and the reference node 108 when the frequency of the signal at the interface 104 exceeds the expected maximum frequency associated with the input signal to (or output signal from) the functional circuitry 102 at the interface 104. In some embodiments, the frequency triggering arrangement 112 activates the first discharge circuitry 114 prior to the voltage at the interface 104 exceeding the operating voltage of the functional circuitry 102. Thereafter, voltage triggering arrangement 122 activates the second discharge circuitry 124 to conduct current between the interface 104 and the reference node 108 when the voltage at the interface 104 exceeds a threshold triggering voltage. The voltage triggering arrangement 122 maintains the second discharge circuitry 124 activated until the voltage at the interface 104 falls below a holding voltage or other threshold that indicates the ESD event has ceased or been sufficiently dissipated. In embodiments where the frequency triggering arrangement 112 temporarily activates the first discharge circuitry 114, the voltage triggering arrangement 122 is configured to maintain the discharge by activating the second discharge circuitry 124 before the frequency triggering arrangement 112 deactivates the first discharge circuitry 114. In this regard, by virtue of the activation of the first discharge circuitry 114 and the second discharge circuitry 124 overlapping in time, the exposure to any ESD event by the functional circuitry 102 is minimized.

Figure 2:
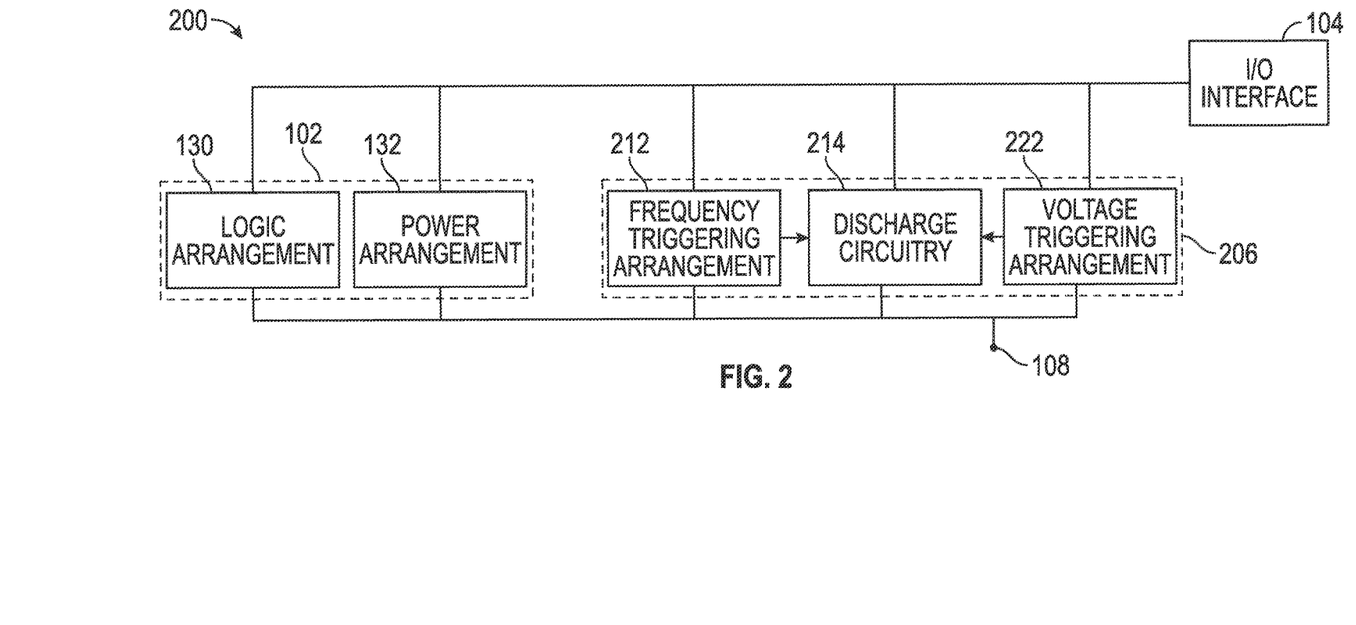
FIG. 2 depicts a block diagram of a semiconductor device including a multi-triggered electrostatic discharge protection arrangement in accordance with one or more embodiments of the invention.

Referring now to FIG. 2, in accordance with one or more embodiments, the multi-triggered protection arrangement 206 of a semiconductor device 200 includes a single instance of discharge circuitry 214 that is shared by different triggering arrangements 212, 222 with different discharge triggering criteria. In this regard, the discharge circuitry 214 may be activated or otherwise operated by either of the triggering arrangements 212, 222. It will be appreciated that by virtue of sharing the discharge circuitry 214 across multiple different triggering arrangements 212, 222, enhanced ESD protection may be provided without incurring additional area or cost penalties that could otherwise be associated with using multiple instances of discharge circuitry for a respective I/O interface 104. Various elements of the semiconductor device 200 of FIG. 2 are similar to counterpart elements described above in the context of FIG. 1, and such common features and functionality will not be redundantly described here in the context of FIG. 2.

In the embodiment of FIG. 2, the first triggering arrangement 212 initiates discharge of the signal at the interface 104 by activating the discharging circuitry 214 to conduct current between the interface 104 and the reference node 108 based on the first characteristic of the signal at the interface 104. Thereafter, the second triggering arrangement 222 maintains the discharge circuitry 214 activated based on a second characteristic of the signal. Thus, while the first triggering arrangement 212 may stop detecting an ESD event (e.g., when the discharge circuitry 214 begins to stabilize the voltage at the interface 104) and attempt to deassert or deactivate the discharge circuitry 214, the second triggering arrangement 222 maintains the discharge circuitry 214 activated when the signal at the interface 104 is still indicative of an ESD event based on its triggering criterion. In this regard, the first triggering arrangement 212 may be configured to respond quickly to a potential ESD event and at least temporarily activate the discharging circuitry 214 before the voltage at the interface 104 exceeds an operating voltage of the functional circuitry 102, with the second triggering arrangement 222 subsequently maintaining the discharging circuitry 214 activated after the voltage exceeds the operating voltage of the functional circuitry 102 until detecting protection from the ESD event is no longer necessary (e.g., once the voltage at the interface 104 is less than the operating voltage of the functional circuitry 102).

In a similar manner as described above, the discharge circuitry 214 is connected between the I/O interface 104 and the reference node 108 electrically parallel to the functional circuitry 102. The first triggering arrangement 212 is coupled to the discharge circuitry 214 to activate the discharge circuitry 214 and initiate discharge of the electrical signal at the interface 104 based on a first discharge triggering criterion. The second triggering arrangement 222 is coupled to the discharge circuitry 214 to activate the discharge circuitry 214 and discharge of the electrical signal at the interface 104 based on a second discharge triggering criterion different from that of the first triggering arrangement 212. In this regard, as described above, in exemplary embodiments, the first triggering arrangement 212 is configured to identify or otherwise detect an ESD event before the second triggering arrangement 222, such that the first triggering arrangement 212 may initially activate the discharge circuitry 214, with the second triggering arrangement 222 maintaining the discharge circuitry 214 in an activated state if the ESD event persists. For example, the first triggering arrangement 212 may activate the discharge circuitry 214 when the frequency of the voltage (or the rise time) at the I/O interface 104 exceeds a threshold frequency (or threshold rise time) unlikely to be exhibited at the I/O interface 104 during normal operation. Thereafter, the second triggering arrangement 222 may maintain the discharge circuitry 214 activated when the voltage at the I/O interface 104 exceeds the design voltage of the functional circuitry 102 even if the frequency of the voltage (or the rise time) at the I/O interface 104 has fallen back below the threshold frequency (or threshold rise time).

Figure 3:
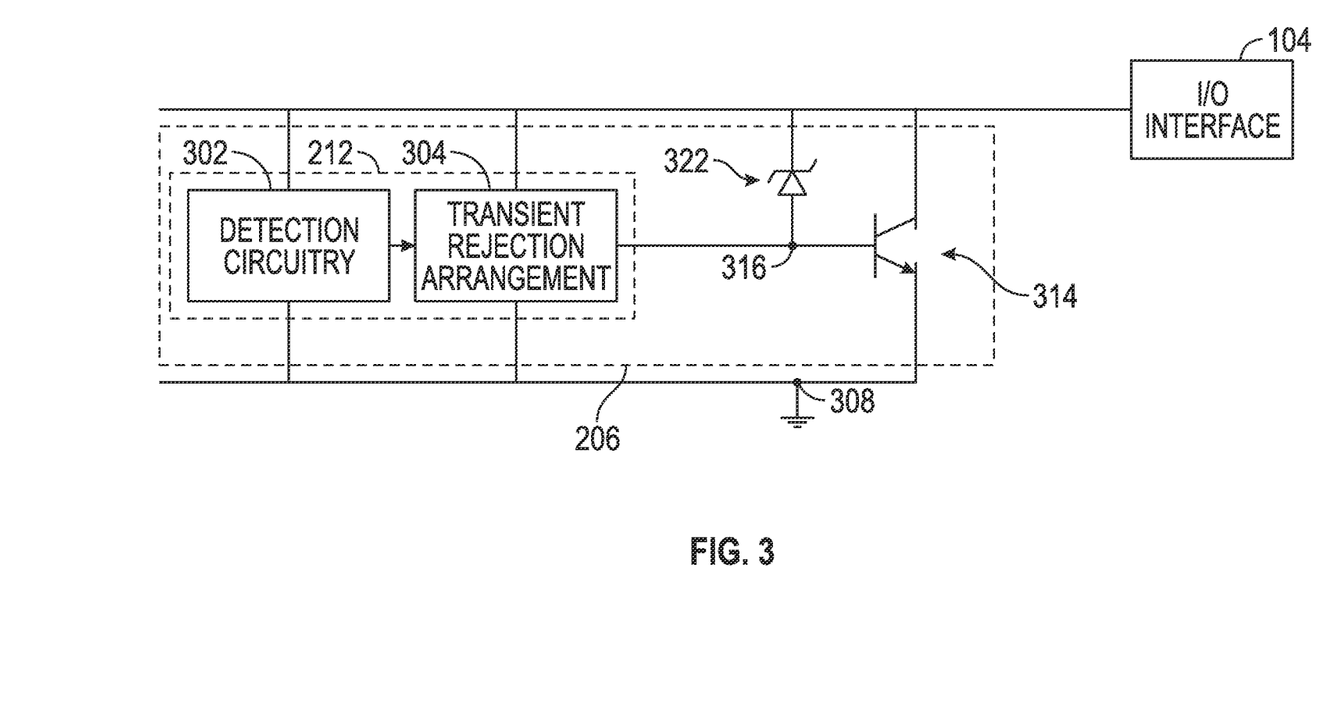
FIG. 3 depicts a schematic view of an exemplary multi-triggered electrostatic discharge protection arrangement suitable for use in the semiconductor device of FIG. 2 in accordance with one or more embodiments of the invention.

FIG. 3 depicts a schematic view of the protection arrangement 206 of FIG. 2 in accordance with one or more exemplary embodiments. In the illustrated embodiment, the discharge circuitry 214 is realized as a transistor 314 coupled between the I/O interface 104 and a ground reference voltage node 308 electrically parallel to whatever functional circuitry may be connected between the I/O interface 104 and the ground reference voltage node 308. The illustrated transistor 314 is realized as a bipolar junction transistor (BJT) having a collector terminal connected to the I/O interface 104 and an emitter terminal connected to the ground reference voltage node 308. In the illustrated embodiment, the voltage triggering arrangement 222 is realized as a Zener diode 322 coupled between the I/O interface 104 (or alternatively, the collector terminal of the BJT 314) and the base terminal of the BJT 314 at an intermediate node 316. The cathode terminal of the Zener diode 322 is connected to the I/O interface 104 and the anode terminal of the Zener diode 322 is connected to the base terminal at node 316.

When a voltage at the I/O interface 104 exceeds the voltage at the base node 316 by more than the avalanche breakdown voltage, the Zener diode 322 conducts current, thereby raising the voltage at the base node 316 and forward biasing the base-emitter junction to turn on the BJT 314. In this regard, the voltage difference between the I/O interface 104 and the ground reference voltage node 308 required to turn on the BJT 314 is greater than the design voltage of the functional circuitry configured electrically parallel between the I/O interface 104 and the ground reference voltage node 308. The BJT 314 dissipates ESD current from the I/O interface 104 to the ground reference voltage node 308 and clamps the voltage difference between the I/O interface 104 and the ground reference voltage node 308. In this regard, the voltage is clamped to a holding voltage that corresponds to the Zener breakdown voltage. In some embodiments, the holding voltage provided by the combination of the Zener diode 322 and the BJT 314 is greater than the design voltage of the functional circuitry, such that the BJT 314 turns off and stops conducting current when the voltage at the I/O interface 104 returns to the design voltage to prevent latchup.

In the illustrated embodiment, the frequency triggering arrangement 212 includes a rise or frequency detection arrangement 302 coupled to a transient rejection arrangement 304 configured to activate the BJT 314 based on the output of the detection arrangement 302. In this regard, the detection arrangement 302 is connected to the I/O interface 104 and configured to generate or otherwise provide an indication (e.g., a logical high voltage or a voltage substantially equal to voltage at the I/O interface 104) to the transient rejection arrangement 304 when the rate of the rise in the voltage at the I/O interface 104 indicates a signal frequency that is greater than a threshold frequency. For example, the detection arrangement 302 may be realized as an inverter having a resistive element connected between the inverter input and the ground reference node 308 and a capacitive element connected between the inverter input and the I/O interface 104, with the resistive element and the capacitive element being configured to provide a time constant that results in the inverter generating a logical high output voltage at the inverter output (e.g., by the capacitive element pulling the inverter input to the ground reference node 308) when the frequency of the voltage at the I/O interface 104 (or alternatively, the rate of the rise in the voltage at the I/O interface 104) is greater than the threshold frequency. The transient rejection arrangement 304 generally represents the components connected between the I/O interface 104 and the ground reference node 308, which are connected to the output of the rise or frequency detection arrangement 302 (e.g., the inverter output) to filter, reject, or otherwise negate any transient or spurious indications from the detection arrangement 302. In response to a sustained indication that the rate of the rise in the voltage at the I/O interface 104 is greater than the threshold frequency, the transient rejection arrangement 304 generates a corresponding voltage at the input node 316 of the discharge circuitry 314. In this manner, the frequency triggering arrangement 212 turns on the BJT 314 while the input signal at the I/O interface 104 has a substantially high frequency, which is likely to occur before the voltage at the I/O interface 104 exceeds the triggering voltage provided by the Zener diode 322 and the BJT 314.

Figure 4:
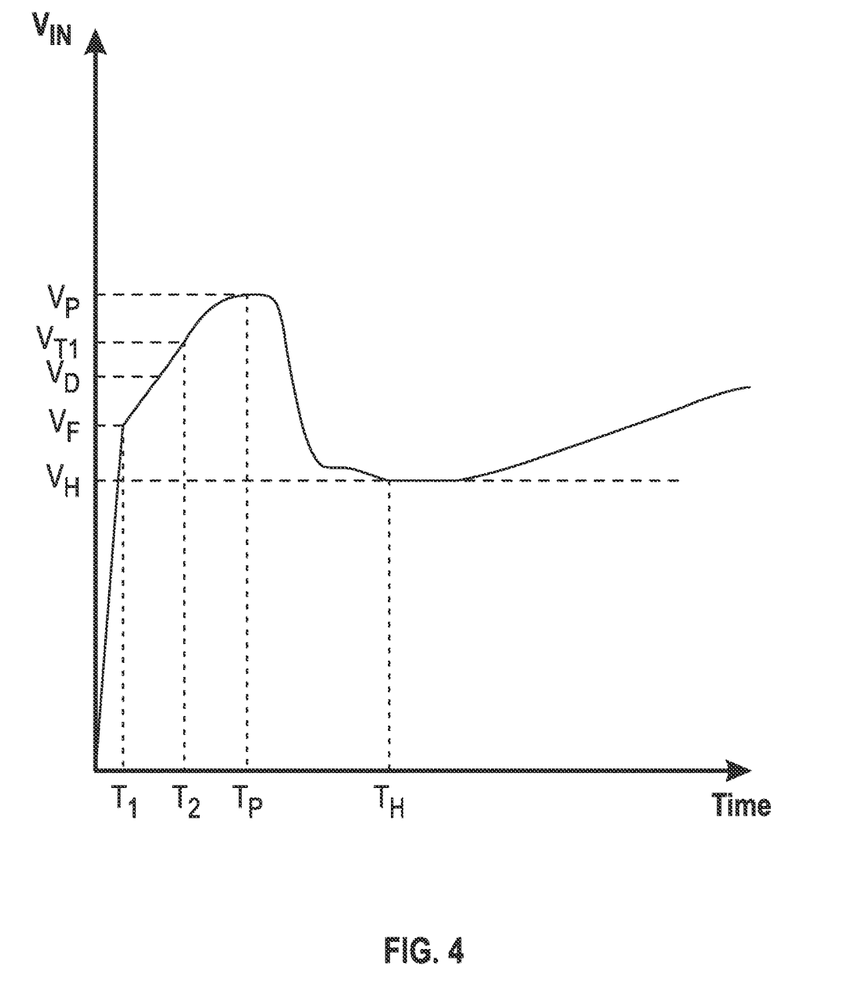
FIG. 4 is a graph depicting the relationship between an input voltage with respect to time for a semiconductor devices having multi-triggered electrostatic discharge protection in accordance with one embodiment.

FIG. 4 illustrates a graph of an input ESD voltage ($V_{IN}$) at the I/O interface 104 versus time for an exemplary embodiment of the protection arrangement 106, 206 described herein. As illustrated, as the input ESD voltage rises, at some initial time ($T_1$), the frequency triggering arrangement 112, 212 detects or otherwise identifies that the frequency of the voltage at the I/O interface 104 is greater than the maximum expected frequency during normal operation of the functional circuitry 102. In response to detecting that the frequency of the input voltage exceeds a threshold, the frequency triggering arrangement 112, 212 initiates discharge of the input ESD voltage when it is at a voltage level ($V_F$) that may be less than the design voltage ($V_D$) of the functional circuitry 102. In this regard, the protection arrangement 106, 206 may begin absorbing or otherwise dissipating the ESD current before input ESD voltage exceeds the design voltage ($V_D$), thereby reducing exposure to the ESD event for the functional circuitry 102. As illustrated, by initiating the discharge of the ESD current earlier, the protection arrangement 106, 206 may also slow the rate of increase in the ESD voltage at the I/O interface 104.

Thereafter, at some subsequent time ($T_2$), the voltage triggering arrangement 122, 222 detects or otherwise identifies that the input ESD voltage ($V_{IN}$) exceeds the triggering voltage ($V_{T1}$) for activating the discharge circuitry 124, 214. As illustrated, the rate of increase of the input ESD voltage ($V_{IN}$) may continually decrease until reaching a peak voltage ($V_P$) when the discharge circuitry 124, 214 is fully turned on at a subsequent time ($T_P$). Thereafter, once fully turned on, the discharge circuitry 124, 214 clamps the voltage difference between the I/O interface 104 and the reference node 108 to the holding voltage ($V_H$) by subsequent time ($T_H$). It should be noted that as the rate of increase in the input ESD voltage ($V_{IN}$) decreases, the frequency triggering arrangement 112, 212 may cease detecting an ESD event and deactivate the discharge circuitry 114, 214. In this regard, the frequency triggering arrangement 112, 212 may temporarily activate the discharge circuitry 114, 214 for a limited duration of time (e.g., from $T_1$ to $T_P$), during which the voltage triggering arrangement 122, 222 will activate the discharge circuitry 124, 214 prior to the frequency triggering arrangement 112, 212 attempting to deactivate the discharge circuitry 114, 214. However, the voltage triggering arrangement 122, 222 maintains the discharge circuitry 124, 214 activated until the input ESD voltage falls below the holding voltage ($V_H$), at which point the protection arrangement 106, 206 will stop conducting current if the applied voltage between the input terminal 104 and the reference node 108 falls below the holding voltage. Alternatively, if the applied ESD voltage (or current) continues increasing, thermal breakdown of the protection arrangement 106, 206 may occur.

By virtue of the subject matter described herein, the exposure of the functional circuitry 102 to the ESD event before the time the voltage triggering arrangement 122, 222 activates the discharge circuitry 124, 214 is reduced by virtue of the frequency triggering arrangement 112, 212 activating discharge circuitry 114, 214 in advance. In this regard, over the duration of time ($T_2$–$T_1$) between the frequency triggering arrangement 112, 212 activating discharge circuitry 114, 214 and the input ESD voltage reaching the triggering voltage ($V_{T1}$) of the voltage triggering arrangement 122, 222, at least a portion of the ESD current is dissipated by the discharge circuitry 114, 214 providing a parallel path from the I/O interface 104 to the reference node 108. At the same time, the frequency triggering arrangement 112, 212 disregards frequencies at the I/O interface 104 that are consistent with normal operation of the functional circuitry 102, and thus, does not interfere with normal operations of the functional circuitry 102. Moreover, as described above in the context of FIGS. 2-3, the discharge circuitry 114, 124 may be combined or otherwise integrated as a common discharge circuitry 214 having multiple different triggers to reduce any area or cost penalty that would otherwise be incurred by having multiple different instances of discharge circuitry 114, 124 as depicted in FIG. 1.

For the sake of brevity, conventional techniques related to semiconductor and/or integrated circuit fabrication, power transistors, smart power devices, biasing, device breakdown, ESD protection, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

In conclusion, systems, devices, and methods configured in accordance with example embodiments of the invention relate to:

An apparatus for a semiconductor device is provided. The semiconductor device comprises an interface for a signal and a multi-triggered protection arrangement coupled between the interface and a reference node to initiate discharge of the signal between the interface and the reference node based on any one of a plurality of different characteristics of the signal. In some embodiments, the semiconductor device further comprises functional circuitry coupled between the interface and the reference node, wherein the multi-triggered protection arrangement is coupled between the interface and the reference node electrically parallel to the functional circuitry. In another embodiment, the multi-triggered protection arrangement includes a first triggering arrangement coupled to the interface to initiate discharge of the signal between the interface and the reference node based on a first characteristic of the signal, and a second triggering arrangement coupled to the interface to initiate discharge of the signal between the interface and the reference node based on a second characteristic of the signal, wherein the second characteristic is different from the first characteristic. In one embodiment, the signal comprises an electrical signal having a voltage, wherein the first triggering arrangement comprises a frequency triggering arrangement to initiate the discharge of the electrical signal between the interface and the reference node based on a frequency of the voltage, and the second triggering arrangement comprises a voltage triggering arrangement to initiate the discharge of the electrical signal between the interface and the reference node based on a magnitude of the voltage. In a further embodiment, the frequency triggering arrangement initiates the discharge of the electrical signal between the interface and the reference node based on the frequency of the voltage exceeding an operating frequency associated with the interface, and the voltage triggering arrangement initiates the discharge of the electrical signal between the interface and the reference node based on the magnitude of the voltage exceeding an operating voltage associated with the interface. In one embodiment, the interface comprises a first input to receive a supply reference voltage and the reference node is connected to a second input to receive a ground reference voltage. In another embodiment, the multi-triggered protection arrangement includes discharge circuitry connected between the interface and the reference node, the first triggering arrangement is coupled to the discharge circuitry to activate the discharge circuitry based on the first characteristic of the signal, the discharge circuitry conducts current between the interface and the reference node when activated, and the second triggering arrangement is coupled to the discharge circuitry to activate the discharge circuitry based on the second characteristic of the signal. In a further embodiment, the first triggering arrangement activates the discharge circuitry prior to the second triggering arrangement, and the second triggering arrangement maintains the discharge circuitry activated based on the second characteristic of the signal. In yet another embodiment, the multi-triggered protection arrangement includes first discharge circuitry connected between the interface and the reference node and second discharge circuitry connected between the interface and the reference node, the first discharge circuitry and the second discharge circuitry are electrically parallel, the first triggering arrangement is coupled to the first discharge circuitry to activate the first discharge circuitry based on the first characteristic of the signal, the first discharge circuitry conducts current between the interface and the reference node when activated, the second triggering arrangement is coupled to the second discharge circuitry to activate the second discharge circuitry based on the second characteristic of the signal, and the second discharge circuitry conducts current between the interface and the reference node when activated. In a further embodiment, the first triggering arrangement temporarily activates the first discharge circuitry for a limited duration of time, and the second triggering arrangement activates the second discharge circuitry during the temporary duration of time prior to the first triggering arrangement deactivating the first discharge circuitry.

In another embodiment, an apparatus for a semiconductor device comprises an interface for an input electrical signal, functional circuitry coupled between the interface and a reference node, a first triggering arrangement coupled to the interface to initiate discharge of the input electrical signal between the interface and the reference node electrically parallel to the functional circuitry based on a first characteristic of the input electrical signal, and a second triggering arrangement coupled to the interface to initiate discharge of the input electrical signal between the interface and the reference node electrically parallel to the functional circuitry based on a second characteristic of the input electrical signal, wherein the second characteristic is different from the first characteristic. In one embodiment, the semiconductor device further comprises discharge circuitry connected between the interface and the reference node electrically parallel to the functional circuitry, the discharge circuitry conducting current between the interface and the reference node when activated, wherein the first triggering arrangement is coupled to the discharge circuitry to activate the discharge circuitry based on the first characteristic of the input electrical signal and the second triggering arrangement is coupled to the discharge circuitry to activate the discharge circuitry based on the second characteristic of the input electrical signal. In one embodiment, the first triggering arrangement activates the discharge circuitry based on a frequency of the input electrical signal prior to the second triggering arrangement activating the discharge circuitry, and the second triggering arrangement maintains the discharge circuitry activated based on a voltage of the input electrical signal. In another embodiment, the semiconductor device comprises first discharge circuitry connected between the interface and the reference node electrically parallel to the functional circuitry, the first discharge circuitry conducting current between the interface and the reference node when activated, wherein the first triggering arrangement is coupled to the first discharge circuitry to activate the first discharge circuitry based on the first characteristic of the input electrical signal, and second discharge circuitry connected between the interface and the reference node electrically parallel to the functional circuitry, the second discharge circuitry conducting current between the interface and the reference node when activated, wherein the second triggering arrangement is coupled to the second discharge circuitry to activate the second discharge circuitry based on the second characteristic of the input electrical signal. In a further embodiment, the first triggering arrangement activates the first discharge circuitry prior to the second triggering arrangement activating the second discharge circuitry.

A method of protecting functional circuitry connected to an interface of a semiconductor device is also provided. The method comprises initiating discharge of a signal at the interface from the interface to a reference node electrically parallel to the functional circuitry based on a first characteristic of the signal, and thereafter, maintaining the discharge of the signal from the interface to the reference node based on a second characteristic of the signal that is different from the first characteristic of the signal. In one embodiment, initiating the discharge comprises activating discharge circuitry connected between the interface and the reference node to conduct current between the interface and the reference node based on the first characteristic, and maintaining the discharge comprises maintaining activation of the discharge circuitry based on the second characteristic. In a further embodiment, the first characteristic comprises a frequency and the second characteristic comprising a voltage, wherein activating the discharge circuitry comprises activating the discharge circuitry in response to the frequency of the signal being greater than an expected frequency of an input signal to the functional circuitry, and maintaining activation of the discharge circuitry comprises maintaining activation of the discharge circuitry based on the voltage of the signal after the voltage exceeds an operating voltage of the functional circuitry. In another embodiment, initiating the discharge comprises activating first discharge circuitry connected between the interface and the reference node to conduct current between the interface and the reference node based on the first characteristic, and maintaining the discharge comprises activating second discharge circuitry based on the second characteristic, the second discharge circuitry being connected between the interface and the reference node electrically parallel to the first discharge circuitry to conduct current between the interface and the reference node when activated. In a further embodiment, the first characteristic comprises a frequency and the second characteristic comprises a voltage, wherein activating the first discharge circuitry comprises activating the first discharge circuitry in response to the frequency of the signal being greater than an expected frequency of an input signal to the functional circuitry, and activating second discharge circuitry based on the second characteristic comprises activating the second discharge circuitry after the voltage of the signal exceeds a triggering voltage and until the voltage is less than a threshold voltage.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device comprising:
an interface for a voltage signal; and
a multi-triggered protection arrangement coupled between the interface and a reference node to initiate discharge of the voltage signal between the interface and the reference node based on any one of a plurality of different characteristics of the voltage signal, wherein the multi-triggered protection arrangement comprises:
a frequency triggering arrangement coupled to the interface to initiate the discharge of the voltage signal between the interface and the reference node based on a frequency of the voltage signal; and
a voltage triggering arrangement coupled to the interface to initiate the discharge of the voltage signal between the interface and the reference node based on a magnitude of the voltage signal.

2. The semiconductor device of claim 1, further comprising functional circuitry coupled between the interface and the reference node, wherein the multi-triggered protection arrangement is coupled between the interface and the reference node electrically parallel to the functional circuitry.

3. The semiconductor device of claim 1, wherein:
the frequency triggering arrangement initiates the discharge of the voltage signal between the interface and the reference node based on the frequency of the voltage signal exceeding an operating frequency associated with the interface; and
the voltage triggering arrangement initiates the discharge of the voltage signal between the interface and the reference node based on the magnitude of the voltage signal exceeding an operating voltage associated with the interface.

4. The semiconductor device of claim 3, wherein:
the interface comprises a first input to receive a supply reference voltage; and
the reference node is connected to a second input to receive a ground reference voltage.

5. A semiconductor device comprising:
an interface for a signal; and
a multi-triggered protection arrangement coupled between the interface and a reference node to initiate discharge of the signal between the interface and the reference node based on any one of a plurality of different characteristics of the signal, wherein:
the multi-triggered protection arrangement includes:
a first triggering arrangement coupled to the interface to initiate discharge of the signal between the interface and the reference node based on a first characteristic of the signal; and
a second triggering arrangement coupled to the interface to initiate discharge of the signal between the interface and the reference node based on a second characteristic of the signal; and
discharge circuitry connected between the interface and the reference node;
the second characteristic is different from the first characteristic;
the first triggering arrangement is coupled to the discharge circuitry to activate the discharge circuitry based on the first characteristic of the signal;
the discharge circuitry conducts current between the interface and the reference node when activated; and
the second triggering arrangement is coupled to the discharge circuitry to activate the discharge circuitry based on the second characteristic of the signal.

6. The semiconductor device of claim 5, wherein:
the first triggering arrangement activates the discharge circuitry prior to the second triggering arrangement; and
the second triggering arrangement maintains the discharge circuitry activated based on the second characteristic of the signal.

7. The semiconductor device of claim 5, wherein:
the first triggering arrangement activates the discharge circuitry based on a frequency of the signal prior to the second triggering arrangement activating the discharge circuitry; and
the second triggering arrangement maintains the discharge circuitry activated based on a voltage of the signal.

8. The semiconductor device of claim 5, wherein the interface comprises an input/output (I/O) interface for functional circuitry encapsulated in the semiconductor device.

9. A semiconductor device comprising:
an interface for a signal; and
a multi-triggered protection arrangement coupled between the interface and a reference node to initiate discharge of the signal between the interface and the reference node based on any one of a plurality of different characteristics of the signal, wherein:
the multi-triggered protection arrangement includes:
a first triggering arrangement coupled to the interface to initiate discharge of the signal between the interface and the reference node based on a first characteristic of the signal; and
a second triggering arrangement coupled to the interface to initiate discharge of the signal between the interface and the reference node based on a second characteristic of the signal;
first discharge circuitry connected between the interface and the reference node; and
second discharge circuitry connected between the interface and the reference node;
the first discharge circuitry and the second discharge circuitry are electrically parallel;
the second characteristic is different from the first characteristic;
the first triggering arrangement is coupled to the first discharge circuitry to activate the first discharge circuitry based on the first characteristic of the signal;
the first discharge circuitry conducts current between the interface and the reference node when activated;
the second triggering arrangement is coupled to the second discharge circuitry to activate the second discharge circuitry based on the second characteristic of the signal; and
the second discharge circuitry conducts current between the interface and the reference node when activated.

10. The semiconductor device of claim 9, wherein:
the first triggering arrangement temporarily activates the first discharge circuitry for a limited duration of time; and
the second triggering arrangement activates the second discharge circuitry during the temporary duration of time prior to the first triggering arrangement deactivating the first discharge circuitry.

11. The semiconductor device of claim 9, further comprising:
functional circuitry coupled between the interface and the reference node.

12. A method of protecting functional circuitry connected to an interface of a semiconductor device, the method comprising:
initiating discharge of a signal at the interface from the interface to a reference node electrically parallel to the functional circuitry based on a first characteristic of the signal by activating discharge circuitry connected between the interface and the reference node to conduct current between the interface and the reference node based on the first characteristic; and
thereafter, maintaining the discharge of the signal from the interface to the reference node based on a second characteristic of the signal that is different from the first characteristic of the signal by maintaining activation of the discharge circuitry based on a second characteristic.

13. The method of claim 12, the first characteristic comprising a frequency and the second characteristic comprising a voltage, wherein:
activating the discharge circuitry comprises activating the discharge circuitry in response to the frequency of the signal being greater than an expected frequency of an input signal to the functional circuitry; and
maintaining activation of the discharge circuitry comprises maintaining activation of the discharge circuitry based on the voltage of the signal after the voltage exceeds an operating voltage of the functional circuitry.

14. A method of protecting functional circuitry connected to an interface of a semiconductor device, the method comprising:
initiating discharge of a signal at the interface from the interface to a reference node electrically parallel to the functional circuitry based on a first characteristic of the signal by activating first discharge circuitry connected between the interface and the reference node to conduct current between the interface and the reference node based on the first characteristic; and
thereafter, maintaining the discharge of the signal from the interface to the reference node based on a second characteristic of the signal that is different from the first characteristic of the signal by activating second discharge circuitry based on the second characteristic, the second discharge circuitry being connected between the interface and the reference node electrically parallel to the first discharge circuitry to conduct current between the interface and the reference node when activated.

15. The method of claim 14, the first characteristic comprising a frequency and the second characteristic comprising a voltage, wherein:
activating the first discharge circuitry comprises activating the first discharge circuitry in response to the frequency of the signal being greater than an expected frequency of an input signal to the functional circuitry; and
activating second discharge circuitry based on the second characteristic comprises activating the second discharge circuitry after the voltage of the signal exceeds a triggering voltage and until the voltage is less than a threshold voltage.

16. The semiconductor device of claim 1, wherein the interface comprises an input/output (I/O) interface for functional circuitry encapsulated in the semiconductor device.

17. The semiconductor device of claim 1, wherein the voltage triggering arrangement comprises a Zener diode.

18. The semiconductor device of claim 9, wherein the interface comprises an input/output (I/O) interface for functional circuitry encapsulated in the semiconductor device.

19. The method of claim 12, wherein the interface comprises an input/output (I/O) interface for the functional circuitry encapsulated in the semiconductor device.

20. The method of claim 14, wherein the interface comprises an input/output (I/O) interface for the functional circuitry encapsulated in the semiconductor device.

* * * * *